United States Patent [19]

Yonezawa et al.

[11] 4,387,192

[45] Jun. 7, 1983

[54] HEAT RESISTANT POLYAMIDE-IMIDE RESIN FROM POLYCARBOXYLIC ACID-POLYISOCYANATE MODIFIED WITH UNSATURATED MONOMER

[75] Inventors: Kazuya Yonezawa; Kazuaki Kira; Hiroshi Wakabayashi; Hirosaku Nagano, all of Kobe, Japan

[73] Assignee: Kanegafuchi Kagaku Kogyo Kabushiki Kaisha, Osaka, Japan

[21] Appl. No.: 167,335

[22] Filed: Jul. 9, 1980

[30] Foreign Application Priority Data

Jul. 13, 1979 [JP] Japan .................. 54/89626

[51] Int. Cl.³ .......................... C08G 69/48
[52] U.S. Cl. .................. 525/426; 525/436; 525/452
[58] Field of Search .......... 525/426, 419, 436, 452, 525/420

[56] References Cited

U.S. PATENT DOCUMENTS 3,541,038 11/1970 Nakano et al. ............ 260/30.6 R
3,658,773 4/1972 Zecher et al. ................. 528/323
3,764,501 10/1973 Hori et al. .................... 525/426

FOREIGN PATENT DOCUMENTS 1342518 1/1974 United Kingdom.

OTHER PUBLICATIONS

English Translation–Claim–Japanese Publication 19274/1969.
English Translation–Claim–Japanese Publication 16080/1967.
English Translation–Claim–Japanese Publication 34455/1974.
Chemical Abstracts–Naming and Indexing of Chemical Compounds, vol. 56, pp. 89,94.

*Primary Examiner*—Harold D. Anderson
*Attorney, Agent, or Firm*—Armstrong, Nikaido, Marmelstein & Kubovcik

[57] ABSTRACT

A heat resistant resin composition comprising a polyamide imide resin having carboxyl groups and modified with an N-methylolated methacryl- or acryl-amide compound and, when desired, further with a bismaleimide compound. The composition has improved properties over conventional polyamide imide resins. When the composition is used, for example, in the form of a film for printed circuit boards, the film has improved heat resistance and enhanced flexural strength and is capable of withstanding soldering baths at high temperatures.

2 Claims, No Drawings

HEAT RESISTANT POLYAMIDE-IMIDE RESIN FROM POLYCARBOXYLIC ACID-POLYISOCYANATE MODIFIED WITH UNSATURATED MONOMER

This invention relates to polyamide imide resins known as heat resistant resins. The object of the invention is to improve the heat resistance and/or flexural strength of polyamide imide resins.

The polyamide imide resins heretofore well known are excellent in electrical characteristics, heat resistance and mechanical properties and are therefore used for electrical insulating varnishes and heat resistant films. It is desired that films for printed circuit boards, for example, be capable of withstanding a soldering bath at 260° to 280° C., whereas the polyamide imide resins commercially available at present still remain to be improved in their heat resistance in such a soldering bath.

We have found that when a polyamide imide resin having carboxyl groups is modified with a compound selected from N-methylolated methacryl- or acryl-amide and derivatives thereof, the resulting resin has improved resistance to heat while retaining the desired electrical characteristics and affords films which have enhanced flexural strength in some cases. Based on this finding, the present invention has been accomplished. Although it appears useful to use a severe curing temperature for imparting improved heat resistance to polyamide imide resin containing carboxyl groups, we have found that the carboxyl group then undergoes condensation with the hydrogen atom on the nitrogen of the intermolecular amide linkage, increasing cross-linked portion causing seriously impaired flexural strength of the film thereof. However, the carboxyl group, when condensed with N-methylolated methacryl- or acryl-amide, permits highly reactive acrylol groups to cross-link with each other more easily without entailing a reduction in the molecular weight of the cross linked portion. This makes it possible to give improved heat resistance to the resin without deteriorating the flexural strength thereof.

According to the invention, useful polyamide imide resins are those having carboxyl groups. Such resins can be prepared by various processes. Among the polyamide imides prepared from polybasic acid anhydrides and diisocyanates, those produced from aromatic polybasic acid anhydrides and aromatic diisocyanates are preferable especially for assuring improved heat resistance. For example, a suitable resin can be prepared by reacting an excess of trimetallitic anhydride with an aromatic diisocyanate at 50° to 200° C. for several hours. In this case, it is desirable to use 1.0 to 1.2 moles of trimellitic anhydride per mole of the diisocyanate. Although a larger amount of the acid anhydride is usable, use of a large excess of the anhydride affords only a polyamide imide polymer of low molecular weight which has insufficient strength for use in the form of a film. Further in such a case it is possible to react an excess of trimellitic anhydride or pyromellitic anhydride with a polyamide imide having a terminal isocyanate group and prepared by the process disclosed in Published Examined Japanese Patent Application No. 16080/1967 to introduce carboxyl groups into the polyamide imide resin.

For the preparation of polyamide imide resins having carboxylic groups, it is generally convenient to use an aromatic diisocyanate as a diisocyanate and an aromatic tribasic acid anhydride as a polybasic acid anhydride in the form of a mixture, which may further contain an aromatic tetrabasic acid anhydride as another polybasic acid anhydride when so desired. This yields a resin having good resistance to heat.

Examples of useful aromatic diisocyanates are tolyene diisocyanate, diphenylmethane diisocyanate, diphenylether diisocyanate, etc., which are used singly or in admixture. Examples of useful aromatic polybasic acid anhydrides are trimellitic anhydride, pyromellitic anhydride, benzophenonetetracarboxylic anhydride, etc. Since the use of at least 50 mole % of trimellitic anhydride affords good results in solubility, it is preferable to use pyromellitic anhydride or benzophenonetetracarboxylic anhydride in an amount of up to 50 mole %, more preferably 0 to 40 mole %, based on total polybasic acid anhydride employed. The polycondensation reaction is conducted with use of a solvent. Exemplary of useful solvents are dimethylformamide, dimethylacetamide, dimethyl sulfoxide, hexamethylphosphoric amide, N-methylpyrrolidone and like aprotic polar solvents. These solvents are usable singly or in admixture. Aromatic hydrocarbons and ketones are also usable conjointly with such solvents insofar as the polyamide imide resin does not separate out.

The polycondensation reaction is carried out preferably at a temperature of 50° to 200° C., more preferably 100° to 180° C. The carboxyl groups in the resulting polyamide imide resin are quantitatively determined by potentiometric titration with use of sodium methylate.

Preferably the polyamide imide resin thus obtained contains at least four carboxyl groups per molecule. Resins containing a smaller number of carboxyl groups, although usable, will not be modified effectively with N-methylolated methacryl- or acryl-amide or derivatives thereof.

N-methylolated methacryl- or acryl-amide and derivatives thereof are used preferably in an amount of about 1.0 to about 5.0 mole equivalent weights, more preferably about 1.0 to about 2.0 mole equivalent weights, per mole equivalent weight of carboxyl groups.

Examples of useful amides are N-methylolated acrylamide, N-methoxymethoxymethylacrylamide, N-butoxymethylacrylamide, N-methylolated methacrylamide, N-butoxymethylmethacrylamide, etc. Although these compounds are usable singly or in admixture, the combined amount of the compounds should not exceed 5 mole equivalent weights per mole equivalent weight of the carboxyl groups. When these amide compounds are used in excessive amounts, the film obtained will have low heat resistance and poor flexural strength.

The polyamide imide having carboxyl groups is reacted with N-methylolated methacryl- or acryl-amide or a derivative thereof at a temperature of 50° to 200° C., preferably 100° to 150° C. for 0.5 to 3 hours. At high temperatures, such amide compounds in the reaction system are likely to polymerize, so that satisfactory results can be achieved if the reaction is effected in the presence of 5 to 200 ppm of a polymerization inhibitor such as BHT (butylated hydroxytoluene).

The polyamide imide resin obtained has the feature of being radially curable and possesses improved resistance to heat and also enhanced flexural strength as compared with the original resin.

We have also found that a resin of further improved heat resistance can be obtained by adding a bismaleimide compound of the formula below including derivatives thereof to the above reaction system for further modification. The bismaleimide compound can be used in the mixture with N-methylolated methacryl- or acryl-amide or a derivative thereof, and polyamide imide resin to be modified, or can be added to the reaction mixture of polyamide imide resin modified with N-methylolated methacryl- or acryl-amide or a derivative. This finding has led to another feature of the invention.

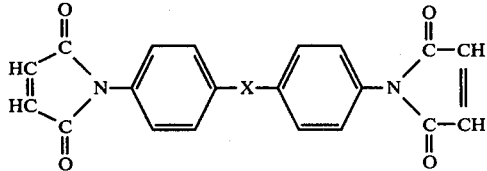

wherein X is $CH_2$, O, $SO_2$, S, or $C(CH_3)_2$.

The carbon-carbon double bond of bismaleimide copolymerizes with the carbon-carbon double bond of N-methylolated methacryl- or acryl-amide or derivative thereof, so that the film obtained is transparent and has outstanding heat resistance.

Bismaleimide is used preferably in an amount of 5 to 50% by weight based on the polyamide imide resin. With less than 5% by weight of bismaleimide present, sufficiently improved heat resistance will not result, whereas use of more than 50% by weight of the compound gives films of impaired flexural strength.

For the preparation of films, azobisisobutyronitrile, azobisvaleronitrile or like zero compound, or di-t-butyl peroxide, benzoyl peroxide or like peroxide can be added to the present resin to promote the formation of films. However, when films are formed at a temperature of not lower than 150° C., the desired film of polyamide imide resin can be obtained merely by heating in the absence of such radical initiator.

The invention will be described in detail with reference to the following examples, to which, however, the invention is not limited.

PREPARATION OF POLYAMIDE IMIDE RESIN I

A 0.95 mole quantity of diphenylmethane diisocyanate (MDI) and 1.00 mole of trimellitic anhydride were placed into a 2-liter three-necked flask having its interior air replaced by nitrogen, and 1200 ml of N-methyl-2-pyrrolidone was further placed into the flask. With stirring, the mixture was reacted at 100° C. for 1.5 hours, at 130° C. for 2 hours and further at 180° C. for 6 hours.

The solution of the polyamide imide resin in N-methyl-2-pyrrolidone had a viscosity of 2,000 centipoises at room temperature.

PREPARATION OF POLYAMIDE IMIDE RESIN II

A 1.02 mole quantity of diphenylmethane diisocyanate and 1.00 mole of trimellitic anhydride were placed into a 2-liter three-necked flask having its interior air replaced by nitrogen, and 1200 ml of N-methyl-2-pyrrolidone was further placed into the flask. The mixture was reacted at 100° C. for 1 hour, at 130° C. for 2 hours and further at 180° C. for 4 hours. Subsequently 0.04 mole of pyromellitic anhydride was added to the mixture, and the resulting mixture was reacted at 130° C. for 2 hours.

A solution of the polyamide imide resin in N-methyl-2-pyrrolidine had a viscosity of 14,000 centipoises at room temperature.

EXAMPLES 1-3

N-methylolated acrylamide was added to a solution of the polyamide imide resin I, and the mixture was treated in the presence of 10 ppm of BHT at 120° C. for 1 hour and thereafter cooled.

Benzoyl peroxide (2% by weight) was added to the resulting mixture, and the resin solution obtained was applied to a glass plate. The coating plate was heated to 180°-280° C. over a period of 30 minutes to prepare a film.

The same procedure as above was repeated with use of the polyamide imide resin II solution and a commercial polyamide imide resin varnish (trademark "HI-400", produt of Hitachi Kasei Co., Ltd., Japan having a viscosity of 6,000 centipoises at room temperature) for Examples 2 and 3, respectively.

The results are given in Table 1, which also shows the properties of films produced from the resins I, II and HI-400.

The films were all 50 μ in thickness.

TABLE 1

| Resin | Carboxyl groups *1 | N—methylolated acrylamide *2 | Heat resistance *3 260° C. | 280° C. | Flexural strength |
|---|---|---|---|---|---|
| Polyamide imide resin I | About 25 | — | c | c | 15 |
| Example 1 | About 25 | About 1.2 | a | b | 28 |
| Polyamide imide resin II | About 16 | — | b | c | 25 |
| Example 2 | About 16 | About 1.1 | a | a-b | 38 |
| HI-400 | About 20 | — | b | c | 21 |
| Example 3 | About 20 | About 1.5 | a | a-b | 34 |

Note:
*1 The number of carboxyl groups per unit of the polyamide imide.
*2 Mole equivalent weights per mole equivalent weight of carboxyl groups in the polyamide imide.
*3 The film was immersed in a soldering bath at 260° C. or 280° C. for 3 seconds. The mark "a" stands for no changes, "b" stands for a film partially formed with irregular patterns, and "c" indicates a film entirely formed with irregular patterns.

Bismaleimides were added to the composition of Example 2 and to the composition of Example 3 and were stirred at room temperature to dissolve, and films were prepared in the same manner as above from the resins obtained. The films were checked for heat resistance with the results given in Table 2.

TABLE 2

| Resin | Bismaleimide | Heat resistance 260° C. | 280° C. |
|---|---|---|---|
| Example 4 (Composition of Ex. 2) | A*4 17 wt. % | a | a-b |
| Example 5 (Composition of Ex. 2) | A 30 wt. % | a | a |

TABLE 2-continued

| Resin | Bismaleimide | Heat resistance 260° C. | 280° C. |
|---|---|---|---|
| Example 6 (Composition of Ex. 3) | A 30 wt. % | a | a |
| Example 7 (Composition of Ex. 2) | B*5 17 wt. % | a | a–b |
| Example 8 (Composition of Ex. 3) | B 17 wt. % | a | a–b |
| Blank HI-400 | — | b | c |

Note:
*4 A is

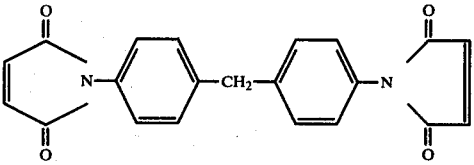

*5 B is

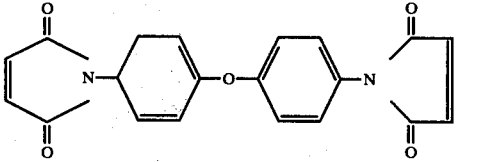

What we claim is:

1. A heat resistant resin composition comprising the reaction product of (1) a polyamide imide resin having carboxyl groups produced from at least one aromatic polycarboxylic acid anhydride having at least three functional carboxyl groups and at least one organic diisocyanate and (2) a compound selected from the group consisting of N-methylolated acryalamide, N-methoxymethylacrylamide, N-butoxymethylacrylamide, N-methylolated methacrylamide and N-butoxymethylmethacrylamide, said compound (2) being used in an amount of 1.0 to 5.0 mole equivalent weights per mole equivalent weight of the carboxyl groups in the polyamide imide resin.

2. The heat resistant resin composition of claim 1 wherein said polyamide imide resin having carboxyl groups contains at least 4 carboxyl groups per molecule.

* * * * *